United States Patent [19]

Lin

[11] Patent Number: 5,771,960
[45] Date of Patent: Jun. 30, 1998

[54] CPU HEAT SINK FASTENER

[76] Inventor: Bob Lin, 15 Fl., No. 49, Nan-Hwa Rd., Chung-Ho City, Taipei Hsien, Taiwan

[21] Appl. No.: 891,621
[22] Filed: Jul. 9, 1997
[51] Int. Cl.[6] ................................ F28F 7/00; H05K 7/20
[52] U.S. Cl. ...................... 165/80.3; 165/185; 174/16.3; 257/719; 361/704
[58] Field of Search ................................. 165/80.3, 185; 174/16.3; 257/718, 719; 361/690, 704, 707, 710

[56] References Cited

U.S. PATENT DOCUMENTS

| | | | |
|---|---|---|---|
| 5,448,449 | 9/1995 | Bright et al. | 361/704 |
| 5,542,468 | 8/1996 | Lin | 165/80.3 |
| 5,600,540 | 2/1997 | Blomquist | 361/704 |
| 5,660,562 | 8/1997 | Lin | 361/704 X |

Primary Examiner—Leonard R. Leo
Attorney, Agent, or Firm—Bacon & Thomas

[57] ABSTRACT

A CPU heat sink fastener fastened to a CPU mount to hold down a heat sink on a CPU above the CPU mount, including a clamping plate having a coupling hole at one end hooked up with a locating block at one side of the CPU mount and two coupling strips at an opposite end and a curved springy stop strip suspending between the coupling strips at a higher elevation, and a locking plate having a finger strip at the top stopped against the curved springy stop strip and a coupling hole at the bottom hooked up with a locating block at an opposite side of the CPU mount and two parallel lugs in the middle respectively pivoted to the coupling strips of the clamping plate.

2 Claims, 4 Drawing Sheets

CPU HEAT SINK FASTENER

BACKGROUND OF THE INVENTION

The present invention relates to a CPU heat sink fastener adapted for securing to a CPU mount to hold down a heat sink on the CPU above the CPU mount, and more particularly to such a CPU heat sink fastener which does not vibrate when installed.

When a CPU of a computer is operated, it produces heat, and heat must be quickly carried away from the CPU during its operation. If heat cannot be quickly carried away from the CPU, the CPU may be unable to function well. Various heat sinks have been disclosed and intensively used for carrying heat from a CPU. When a heat sink is mounted on a CPU above a CPU mount, it must be firmly secured to the CPU mount to hold down the CPU by fastening means. FIGS. 1A and 1B show a CPU heat sink fastener for this purpose. This structure of CPU heat sink fastener comprises a first clamping plate having a coupling hole at one end adapted for coupling to a locating block at one side of the CPU mount and two parallel lugs at an opposite end, a lever having a first pair of parallel lugs respectively pivoted to the lugs of the first clamping plate and a second pair of parallel lugs, and a second clamping plate having a coupling hole at one end adapted for coupling to a locating block at an opposite side of the CPU mount and a pair of parallel lugs at an opposite end respectively pivoted to the second pair of parallel lugs of the lever. This structure of CPU heat sink fastener is complicated, therefore its assembly process is complicated and its manufacturing cost is high. Furthermore, the lever may be forced to damage other component parts of the mother board of the computer when it is not properly turned. U.S. Pat. No. 5,542,468 discloses another structure of fastening means adapted for use with a ZIF (zero insertion force) CPU mount to hold down a heat sink with fan means on a CPU. This structure of fastening means comprises two elongated, narrow metal members. The first metal member has two opposite ends obliquely extending upwards in reversed directions. One end of the first metal member is made with an opening and an extension metal strip adapted for hooking on one hook at one side of the ZIF CPU mount. The other end of the first metal member is made with pivot holes. The second metal member has a top plane adapted for receiving the application of a force, two pivots bilaterally disposed in the middle and respectively pivoted to the pivot holes of the first metal member, and a bottom hole adapted for hooking up with one hook at one side of the ZIF CPU mount opposite to the first metal member. This structure of fastening means is not satisfactory in function because the second metal member tends to vibrate relative to the first metal member. During the installation procedure, the second metal member must be firmly held down with one hand when applying a force to the top plane of the second metal member with the other hand, i.e. the fastening means cannot be conveniently installed with one hand.

SUMMARY OF THE INVENTION

The present invention has been accomplished to provide a CPU heat sink fastener which eliminates the aforesaid drawbacks. It is one object of the present invention to provide a CPU heat sink fastener which has a simple structure. It is another object of the present invention to provide a CPU heat sink fastener which can be conveniently installed with one hand and does not vibrate when installed. It is still another object of the present invention to provide a CPU heat sink fastener which firmly holds down the heat sink on the CPU for quick dissipation of heat when installed. According to one aspect of the present invention, the CPU heat sink fastener comprises a clamping plate having a coupling hole at one end hooked up with a locating block at one side of the CPU mount and two coupling strips at an opposite end and a curved springy stop strip suspending between the coupling strips at a higher elevation, and a locking plate having a finger strip at the top stopped against the curved springy stop strip and a coupling hole at the bottom hooked up with a locating block at an opposite side of the CPU mount and two parallel lugs in the middle respectively pivoted to the coupling strips of the clamping plate. According to another aspect of the present invention, the coupling strips of the clamping plate have a respective front end terminating in a downward stop portion adapted for stopping against the locking plate to keep the coupling hole of the locking plate firmly retained in engagement with the corresponding locating block of the CPU mount.

DETAILED DESCRIPTION OF THE PREFERRED EMBODIMENT

Figure 1A:
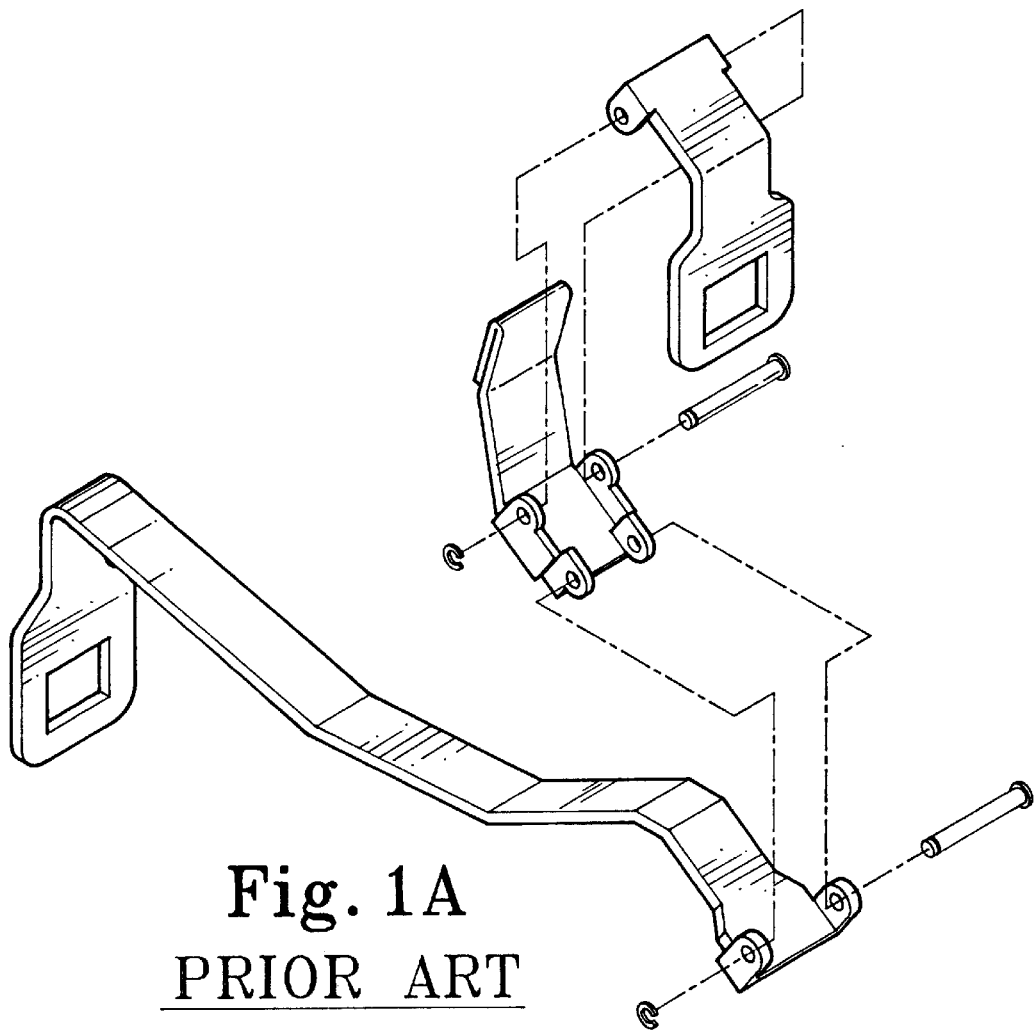
FIG. 1A is an exploded view of a CPU heat sink fastener according to the prior art.
Figure 1B:
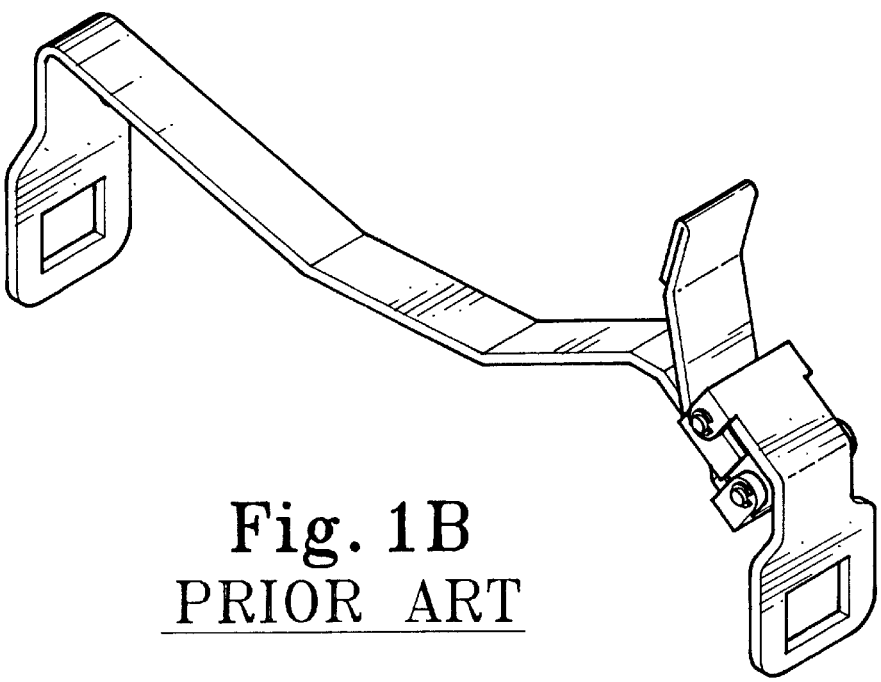
FIG. 1B is an assembly view of the CPU heat sink fastener shown in FIG. 1A.
Figure 2:
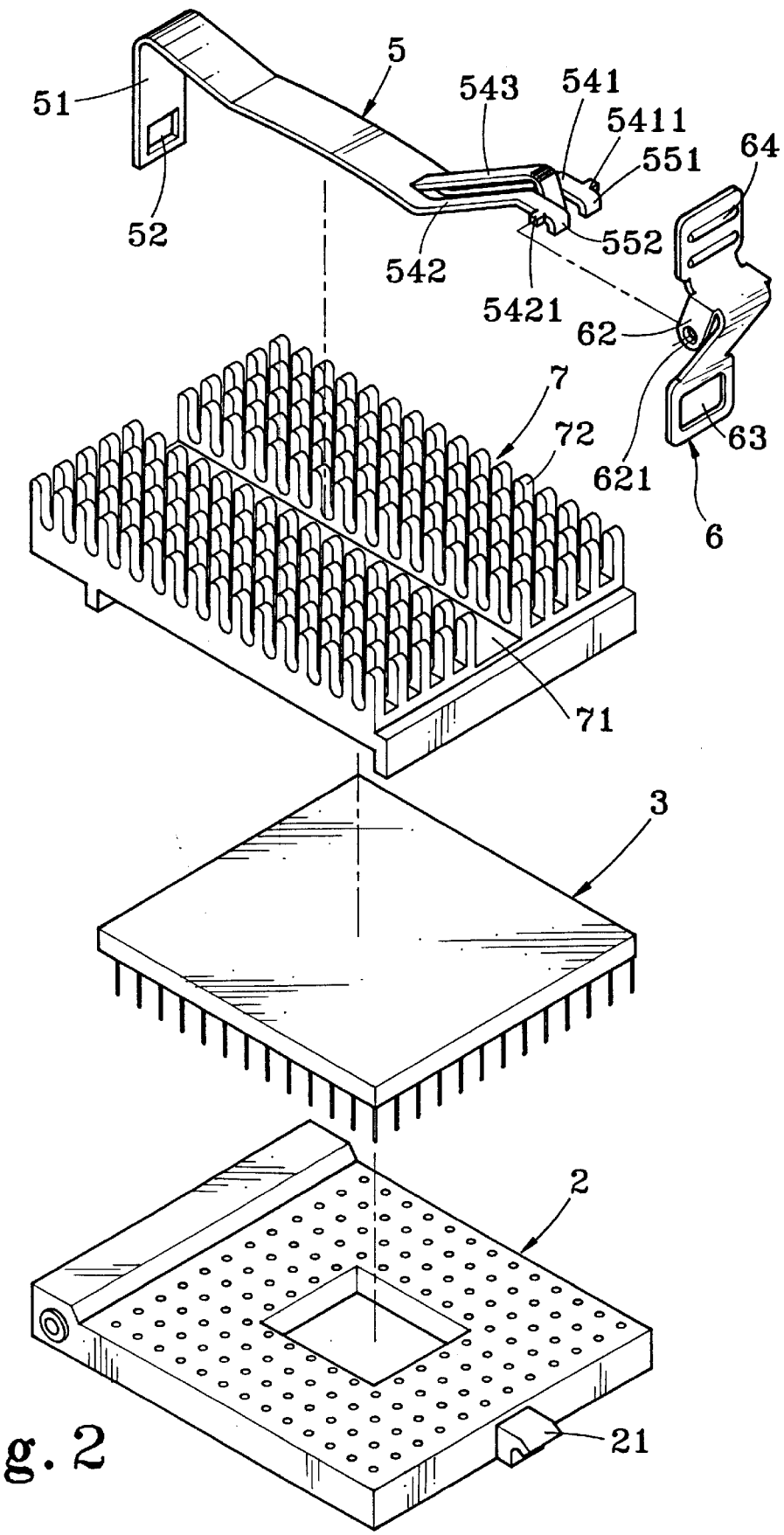
FIG. 2 is an exploded view of the present invention.
Figure 3:
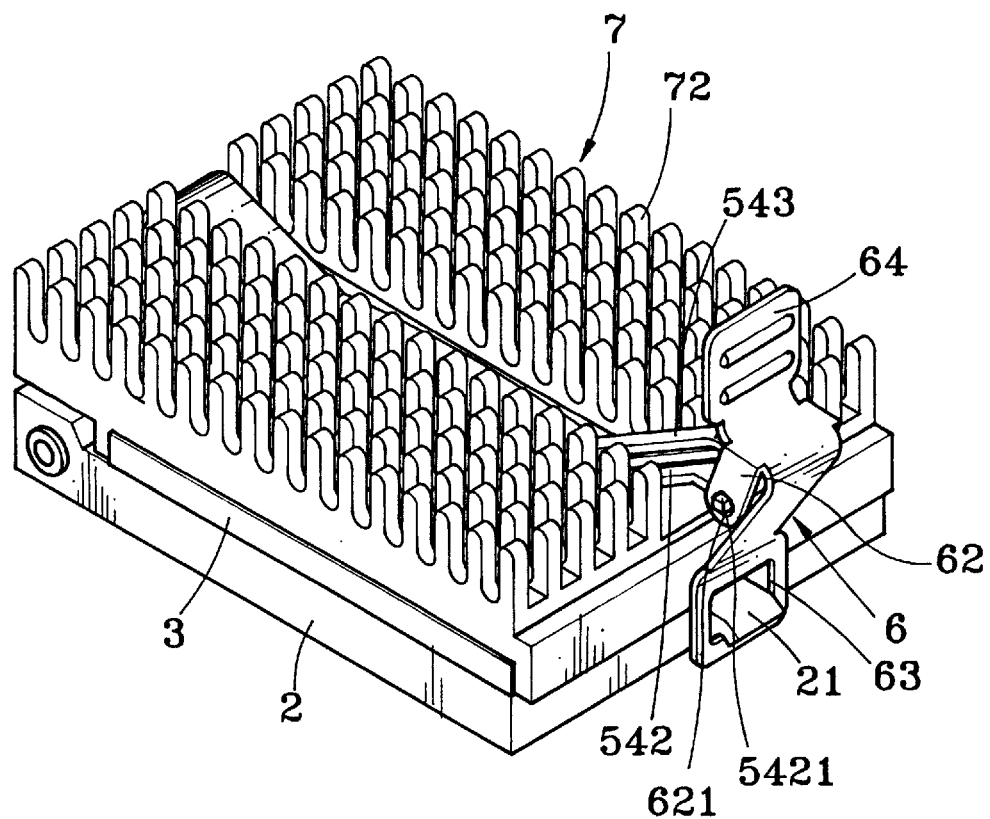
FIG. 3 is an assembly view of FIG. 2.

Referring to FIGS. 2 and 3, a CPU heat sink fastener in accordance with the present invention is adapted for securing to a CPU mount 2 to hold down a heat sink 7 on a CPU 3 above the CPU mount 2, comprised of a clamping plate 5 and a locking plate 6.

Referring to FIG. 2 again, the clamping plate 5 is made from an elongated metal strip having a rear end terminating in a downwardly disposed vertical tail 51, a front end terminating in a first coupling strip 541 and a second coupling trip 542 and a curved springy stop strip 543 between the first coupling strip 541 and the second coupling trip 542. The vertical tail 51 has a coupling hole 52 adapted for securing to one side of the CPU mount 2. The curved springy stop strip 543 suspends in between the first coupling strip 541 and the second coupling strip 542 at a higher elevation. The first coupling strip 541 and the second coupling strip 542 are obliquely upwardly extended from clamping plate 5, having a respective front end terminating in a downward stop portion 551;552. Two pivot rods 5411;5421 are respectively and perpendicularly raised from the first coupling strip 541 and the second coupling strip 542 at an outer side for coupling to the locking plate 6. The first coupling strip 541, the second coupling strip 542 and the curved springy stop strip 543 are preferably integrally made from the material of the clamping plate 5 by stamping. Alternatively, the curved springy stop strip 543 can be fastened to the clamping plate 5 by welding. The locking plate 6 comprises a finger strip 64 at one end, a coupling hole 63 at an opposite end adapted for securing to one side of the CPU mount 2 opposite to the clamping plate 5, and two parallel lugs 61;62 bilaterally disposed in the middle and defining a respective pivot hole 611;621 (see also FIG. 4A). The heat sink 7 comprises a longitudinal mounting groove 71 longitudinally disposed at its top side in the middle, and two sets of longitudinally and transversely aligned upright radiating fins 72 raised from its top side and separated by the longitudinal mounting groove 71. The CPU mount 2 has two locating blocks 21 raised from two opposite vertical peripheral walls thereof.

Figure 4A:
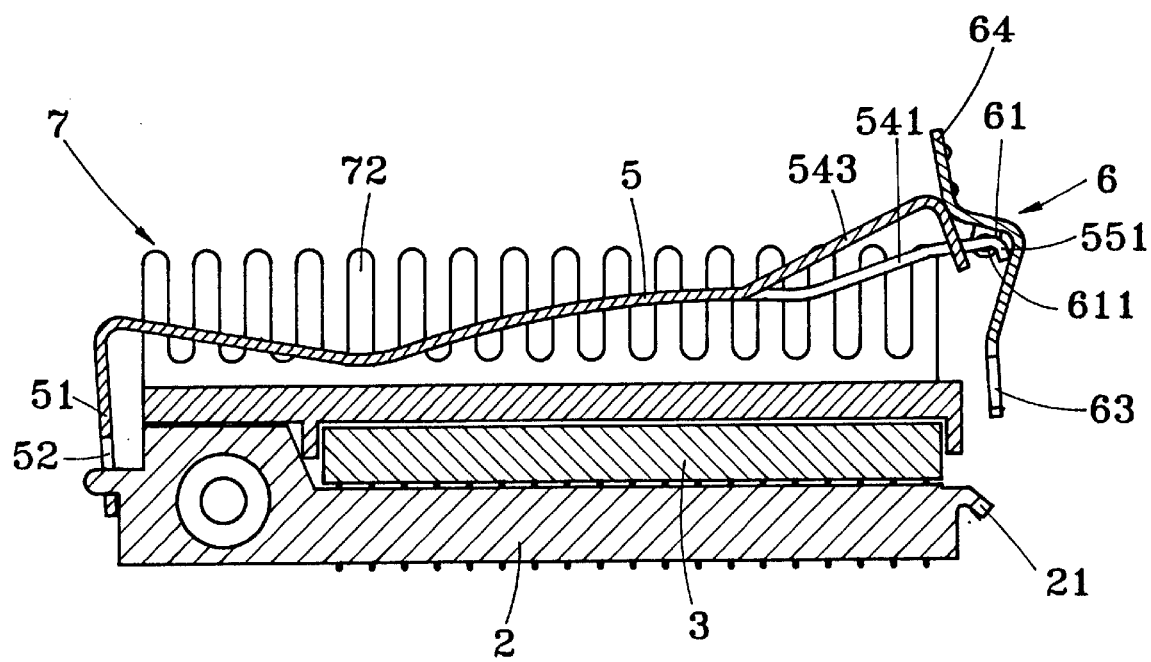
FIG. 4A is a side view of the present invention, showing the clamping plate of the CPU fastener attached to the heat sink and fastened to one locating block of the CPU mount.
Figure 4B:
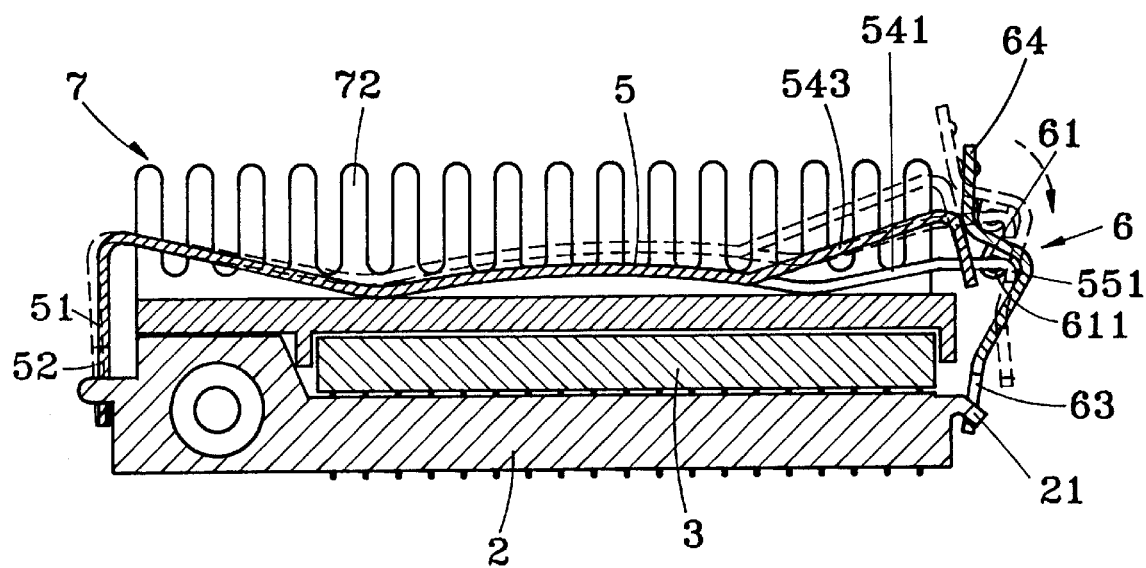
FIG. 4B is another side view of the present invention, showing the CPU fastener attached to the heat sink, the clamping plate and locking plate of the CPU fastener respectively fastened to the locating blocks of the CPU mount.

Referring to FIGS. 4A and 4B, and FIGS. 2 and 3 again, the clamping plate 5 and the locking plate 6 are coupled together by inserting the pivot rods 5411;5421 of the coupling strips 541;542 of the clamping plate 5 into the pivot holes 611;621 of the parallel lugs 61;62 of the locking plate 6, permitting the coupling strips 541;542 of the clamping plate 5 to be retained between the parallel lugs 61;62 of the locking plate 6. When the clamping plate 5 and the locking plate 6 are coupled together, the locking plate 6 can be turned about the pivot rods 5411;5421 of the clamping plate 5. When the CPU heat sink fastener is assembled, the CPU 3 is mounted on the CPU mount 2, then the heat sink 7 is mounted on the CPU 3, and then the clamping plate 5 is attached to the longitudinal groove 71 of the heat sink 7 and coupled to the CPU mount 2 by hooking up the coupling hole 52 of the vertical tail 51 with one locating block 21 of the CPU mount 2 (see FIG. 4A), and then the locking plate 6 is pushed downwards to turn the coupling hole 63 of the locking plate 6 downwardly inwards (from the imaginary line position to the real line position shown in FIG. 4B) into engagement with one locating block 21 at one side of the CPU mount 2 opposite to the clamping plate 5. When the clamping plate 5 and the locking plate 6 are respectively coupled to the locating blocks 21 of the CPU mount 2, the downward stop portion 551;552 of the coupling strips 541;542 are respectively stopped against the locking plate 6 above its coupling hole 63 below the elevation of the lugs 61;62, and the curved springy stop strip 543 is stopped against the finger strip 64 of the locking plate 6 above the elevation of the lugs 61;62, therefore the clamping plate 5 and the locking plate 6 are firmly retained secured to the locating blocks 21 of the CPU mount 2 to hold down the heat sink 7 on the CPU 3. When the finger strip 64 of the locking plate 6 is pushed downwards and then turned outwards against the spring force of the curved springy stop strip 543, the coupling hole 63 of the locking plate 6 is disconnected from the corresponding locating block 21 of the CPU mount 2, and therefore the CPU heat sink fastener can be conveniently removed from the heat sink 7.

Further, the two opposite ends of the clamping plate 5 slope obliquely upwards in reversed directions and then respectively terminating in the downwardly disposed vertical tail 51, and the coupling strips 541;542 and curved springy stop strip 543 (see FIG. 2), therefore the clamping plate 5 imparts a downward pressure to the heat sink 7 when the CPU heat sink fastener is installed.

I claim:

1. A CPU heat sink fastener fastened to a CPU mount to hold down a heat sink on a CPU above said CPU mount, comprising:

a clamping plate attached to a longitudinal groove at a top side of said heat sink, having a downwardly disposed vertical tail at one end attached to one vertical peripheral side of said CPU mount, a coupling hole at said vertical tail hooked onto one locating block of said CPU mount, two parallel coupling strips longitudinally disposed at an opposite end, a curved springy stop strip suspending between said coupling strips at a higher elevation than said coupling strips, and two pivot rods respectively and perpendicularly extending from said coupling strips in opposite directions; and a locking plate having a finger strip at one end stopped against said curved springy stop strip of said clamping plate, a coupling hole at an opposite end forced into engagement with a locating block at another vertical peripheral side of said CPU mount opposite to said clamping plate, two parallel lugs bilaterally disposed in between said ends, and two pivot holes respectively disposed at said lugs and respectively coupled to the pivot rods of said clamping plate for permitting said locking plate to be turned about said pivot rods.

2. The CPU heat sink fastener of claim 1, wherein said coupling strips of said clamping plate have a respective front end terminating in a downward stop portion respectively stopped against said locking plate.

* * * * *